(12) United States Patent
Seon et al.

(10) Patent No.: US 8,658,546 B2
(45) Date of Patent: Feb. 25, 2014

(54) SOLUTION COMPOSITION FOR FORMING OXIDE THIN FILM AND ELECTRONIC DEVICE INCLUDING THE OXIDE THIN FILM

(71) Applicant: Samsung Electronics Co., Ltd., Suwon-Si (KR)

(72) Inventors: Jong-Baek Seon, Yongin-si (KR); Hyun-Jae Kim, Seoul (KR); Sang-Yoon Lee, Seoul (KR); Myung-Kwan Ryu, Yongin-si (KR); Hyun-Soo Shin, Suwon-si (KR); Kyung-Bae Park, Seoul (KR); Woong-Hee Jeong, Seoul (KR); Gun-hee Kim, Seoul (KR); Byung-Du Ahn, Seoul (KR)

(73) Assignees: Samsung Electronics Co., Ltd., Gyeonggi-do (KR); Industry-Academic Cooperation Foundation, Seoul (KR)

( * ) Notice: Subject to any disclaimer, the term of this patent is extended or adjusted under 35 U.S.C. 154(b) by 0 days.

(21) Appl. No.: 13/650,819

(22) Filed: Oct. 12, 2012

(65) Prior Publication Data
US 2013/0036943 A1 Feb. 14, 2013

Related U.S. Application Data

(62) Division of application No. 12/662,292, filed on Apr. 9, 2010.

(30) Foreign Application Priority Data

Apr. 9, 2009 (KR) .................. 10-2009-0031000
Mar. 24, 2010 (KR) .................. 10-2010-0026314

(51) Int. Cl.
*H01L 21/31* (2006.01)
*H01L 21/469* (2006.01)

(52) U.S. Cl.
USPC ............. 438/786; 438/785; 257/79; 257/228; 257/431; 257/E51.005; 257/E51.022

(58) Field of Classification Search
USPC ....... 257/40, 79, 228, 431, E51.005, E51.022
See application file for complete search history.

(56) References Cited

U.S. PATENT DOCUMENTS 5,885,368 A * 3/1999 Lupo et al. .................. 136/263
5,972,527 A   10/1999 Kaijou et al.
(Continued)

FOREIGN PATENT DOCUMENTS

JP   60-220505 A   11/1985
JP   61-190075 A    8/1986
(Continued)

OTHER PUBLICATIONS

Gun Hee Kim et al., "Formation Mechanism of Solution-Processed Nanocrystalline InGaZnO Thin Film as Active Channel Layer in Thin-Film Transistor", *J. Electromechanical Soc.*, vol. 156 (1) pp. H7-H9 (2009).

(Continued)

*Primary Examiner* — Michelle Mandala
(74) *Attorney, Agent, or Firm* — Harness, Dickey & Pierce, P.L.C.

(57) ABSTRACT

A solution composition for forming an oxide thin film may include a first compound including zinc, a second compound including indium, and a third compound including magnesium or hafnium, and an electronic device may include an oxide semiconductor including zinc, indium, and magnesium. The zinc and hafnium may be included at an atomic ratio of about 1:0.01 to about 1:1.

3 Claims, 10 Drawing Sheets

(56) References Cited

U.S. PATENT DOCUMENTS

| | | |
|---|---|---|
| 2004/0113146 A1 | 6/2004 | Dahmani et al. |
| 2004/0150331 A1 | 8/2004 | Okubo et al. |
| 2006/0150891 A1 | 7/2006 | Ichinose et al. |
| 2007/0109218 A1* | 5/2007 | Saito et al. ............... 345/55 |
| 2007/0184576 A1 | 8/2007 | Chang et al. |
| 2007/0194379 A1 | 8/2007 | Hosono et al. |
| 2009/0278122 A1 | 11/2009 | Hosono et al. |
| 2009/0280600 A1 | 11/2009 | Hosono et al. |

FOREIGN PATENT DOCUMENTS

| | | |
|---|---|---|
| JP | 6-187832 A | 7/1994 |
| JP | 09-161542 A | 6/1997 |
| JP | 2000-048966 | 2/2000 |
| JP | 2007-42690 | 2/2007 |
| JP | 2008-288196 A | 11/2008 |
| JP | 2009-048986 A | 5/2009 |
| JP | 2009-135098 A | 6/2009 |
| KR | 2007-0006854 | 1/2007 |
| KR | 2007-0116889 | 12/2007 |
| WO | WO 2005-088726 | 9/2005 |

OTHER PUBLICATIONS

Office Action dated Dec. 5, 2012 in co-pending U.S. Appl. No. 12/656,682.

* cited by examiner

SOLUTION COMPOSITION FOR FORMING OXIDE THIN FILM AND ELECTRONIC DEVICE INCLUDING THE OXIDE THIN FILM

CROSS-REFERENCE TO RELATED APPLICATIONS

This application is a divisional application of U.S. application Ser. No. 12/662,292, filed on Apr. 9, 2010, now allowed now U.S. Pat. No. 8,319,300, which claims priority under U.S.C. §119 to Korean Patent Application No. 10-2009-0031000 and No. 10-2010-0026314 filed in the Korean Intellectual Property Office (KIPO) on Apr. 9, 2009 and Mar. 24, 2010, respectively, the entire contents of each of which are incorporated herein by reference.

BACKGROUND

1. Field

Example embodiments relate to a solution composition for forming an oxide thin film and an electronic device including the oxide thin film.

2. Description of the Related Art

Electronic devices, e.g., resistors, capacitors, diodes, and thin film transistors, are used in various fields. Thin film transistors (TFT) are used for a switching and driving device in a flat panel display, e.g., a liquid crystal display (LCD), an organic light emitting diode display (OLED display), and an electrophoretic display (EPD).

The semiconductor is one of the primary components for determining the characteristics of such electronic devices. Such a semiconductor is generally composed of silicon (Si). Silicon is classified into amorphous silicon and polycrystalline silicon depending upon the crystal shape. Amorphous silicon may be obtained by a relatively simple manufacturing process, but has insufficient charge mobility to provide high performance devices, while polycrystalline silicon has increased charge mobility, but requires a step of crystallizing silicon which increases the cost and complicates the process.

In order to compensate for shortcomings of amorphous silicon and polycrystalline silicon, oxide semiconductors may be used. However the oxide semiconductors may deteriorate stability and reliability of electronic devices because controlling their electric characteristics may be difficult.

SUMMARY

Example embodiments provide a solution composition for forming an oxide thin film being capable of improving electrical characteristics of electronic devices. Example embodiments also provide an electronic device including the oxide thin film.

According to example embodiments, a solution composition for forming an oxide thin film may include a first compound including zinc, a second compound including indium, and a third compound including magnesium.

The zinc and magnesium may be included at an atomic ratio of about 1:0.01 to about 1:4. The zinc and indium may be included at an atomic ratio of about 1:10 to about 10:1. The zinc and indium may be included at an atomic ratio of about 1:5 to about 5:1.

The zinc and indium may be included at an atomic ratio of about 1:10 to about 1:1. The zinc and indium may be included at an atomic ratio of about 1:5 to about 1:1. The third compound may include at least one of magnesium acetate, magnesium alkoxide, magnesium halide, magnesium nitrate, magnesium sulfate, magnesium carbonylate, magnesium carbonate, and hydrates thereof.

The first compound may include at least one of zinc hydroxide, zinc alkoxide, zinc citrate, zinc acetate, zinc carbonylate, zinc carbonate, zinc (meth)acrylate, zinc nitrate, zinc acetylacetonate, zinc halide, zinc thiocarbamate, zinc sulfonate, zinc undecylate, zinc phosphate, zinc borate, and hydrates thereof. The second compound may include at least one of indium hydroxide, indium alkoxide, indium citrate, indium acetate, indium carbonate, indium (meth)acrylate, indium nitrate, indium acetylacetonate, indium halide, indium thiocarbamate, indium sulfonate, indium undecylate, indium borate, and hydrates thereof.

The first compound may include zinc acetate hydrate and the second compound may include indium nitrate hydrate. The solution composition may further include at least one of an alcohol amine compound, an alkyl ammonium hydroxy compound, an alkyl amine compound, ketone compound, an acid compound, a base compound, and deionized water.

According to example embodiments, an electronic device may include an oxide semiconductor including zinc, indium, and magnesium. The oxide semiconductor may include the zinc and magnesium at an atomic ratio of about 1:0.01 to about 1:4. The zinc and indium may be included at an atomic ratio of about 1:10 to about 10:1. The zinc and indium may be included at an atomic ratio of about 1:5 to about 5:1.

The zinc and indium may be included at an atomic ratio of about 1:10 to about 1:1. The zinc and indium may be included at an atomic ratio of about 1:5 to about 1:1. The electronic device may be a thin film transistor that further includes the oxide semiconductor on a gate electrode, a source electrode electrically connected to the oxide semiconductor, and a drain electrode electrically connected to the oxide semiconductor and facing the source electrode.

A solution composition for forming an oxide thin film according to example embodiments may include a first compound including zinc, a second compound including indium, and a third compound including hafnium. The zinc and hafnium may be included at an atomic ratio of about 1:0.05 to about 1:0.3.

The first compound may include zinc acetate hydrate, the second compound may include indium nitrate hydrate, and the third compound may include hafnium chloride. The solution composition may further include at least one of an alcohol amine compound, an alkyl ammonium hydroxy compound, an alkyl amine compound, ketone compound, an acid compound, a base compound, and deionized water.

BRIEF DESCRIPTION OF THE DRAWINGS

Example embodiments will be more clearly understood from the following detailed description taken in conjunction with the accompanying drawings. FIGS. 1-10 represent non-limiting, example embodiments as described herein.

FIG. 1 is a graph showing the current characteristics of the thin film transistors according to Examples I-1 to I-4 and Comparative Example 1, FIG. 3 is a graph showing the current characteristics of the thin film transistors according to Examples II-1 to II-3 and Comparative Example, FIG. 4 is a graph showing hysteresis characteristics of the thin film transistors according to Examples III-1 to III-3, FIG. 5 is a graph showing current characteristics of thin film transistors according to Examples IV-1 to IV-4 and Comparative Example 2, FIG. 7 is a cross sectional view of a thin film transistor according to example embodiments, and FIGS. 8 to 10 are cross-sectional views sequentially showing a method of manufacturing a thin film transistor shown in FIG. 7.

DETAILED DESCRIPTION

Figure 1:
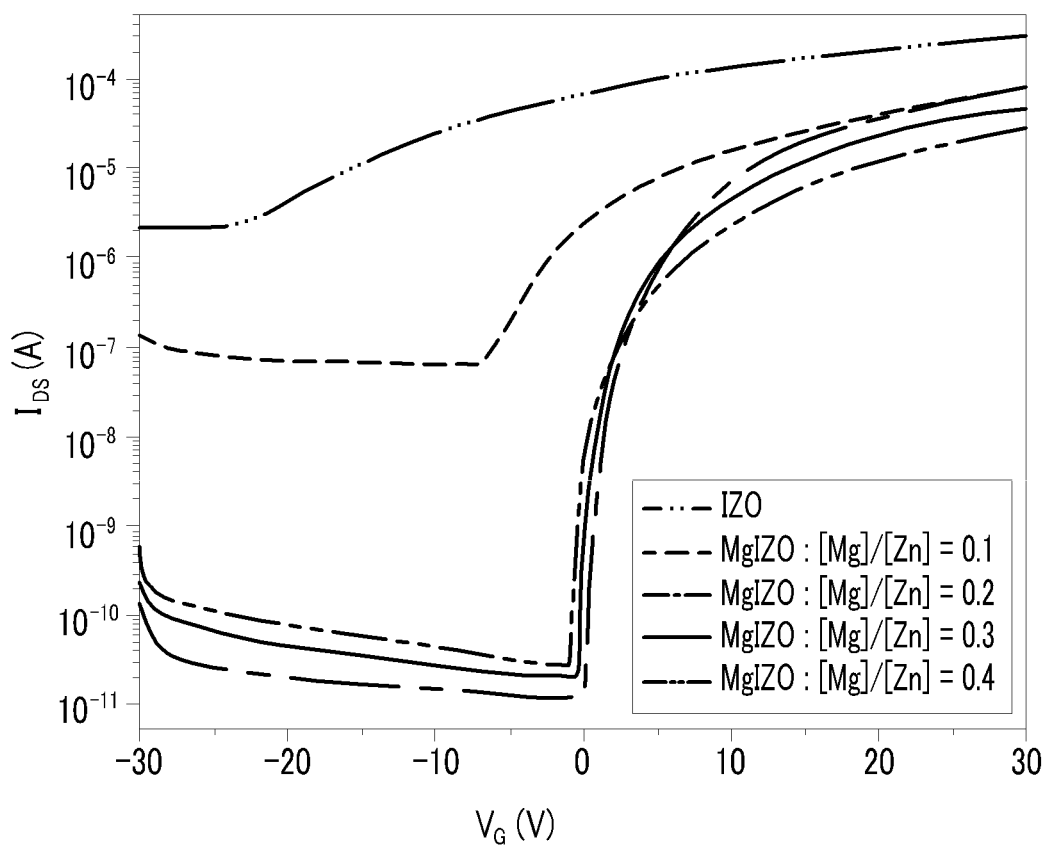

Example embodiments will be described more fully hereinafter with reference to the accompanying drawings. Example embodiments may, however, be embodied in many different forms and should not be construed as limited to example embodiments set forth herein. Accordingly, example embodiments are merely described below, by referring to the figures, to explain aspects of the present description. In the drawings, the sizes or thicknesses of elements are exaggerated for clarity, and like reference numerals denote like elements. It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given example embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature. As used herein, the terms "a" and "an" are open terms that may be used in conjunction with singular items or with plural items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, a solution composition according to example embodiments is described. The solution composition according to example embodiments may be a precursor solution used for forming an oxide semiconductor thin film.

The precursor solution according to example embodiments may include a compound containing zinc (Zn) (hereinafter referred to as "zinc-containing compound"), a compound containing indium (In) (hereinafter referred to as "indium-containing compound"), and a compound containing magnesium (Mg) (hereinafter, referred to as 'magnesium-containing compound").

The zinc-containing compound may be at least one of a zinc salt and a hydrate thereof, but is not limited thereto. Examples of the zinc-containing compound may include at least one of zinc hydroxide; zinc alkoxide; zinc citrate; zinc acetate, e.g., zinc trifluoroacetate; zinc carbonylate; zinc carbonate; zinc (meth)acrylate; zinc nitrate; zinc acetylacetonate, e.g., zinc hexafluoroacetylacetonate; zinc halide, e.g., zinc fluoride, zinc chloride and/or zinc perchlorate; zinc thiocarbamate, e.g., zinc dimethyldithiocarbamate and/or zinc diethyldithiocarbamate; zinc sulfonate, e.g., zinc trifluoromethanesulfonate; zinc undecylate; zinc phosphate; zinc borate, e.g., zinc tetrafluoroborate; and hydrates thereof.

The indium-containing compound may include an indium salt, and its hydrate, but is not limited thereto. Examples of the indium-containing compound may include at least one of indium hydroxide; indium alkoxide; indium citrate; indium acetate; indium carbonate; indium (meth)acrylate; indium nirtrate; indium acetylacetonate; indium halide, e.g., indium chloride and/or indium fluoride; indium thiocarbamate; indium sulfonate; indium undecylate; indium borate; and hydrates thereof.

The magnesium-containing compound may include a magnesium salt, and its hydrate, but is not limited thereto. Examples of the magnesium-containing compound may include at least one of magnesium halides, e.g., magnesium chloride and/or magnesium fluoride; magnesium acetate; magnesium carbonate; magnesium alkoxide; magnesium nitrate; magnesium sulfate; magnesium carbonylate; and hydrates thereof.

Combining the zinc-containing compound, indium-containing compound, and magnesium-containing compound in various ways may be possible. In example embodiments, when the zinc-containing compound is zinc acetate hydrate, the indium-containing compound may be indium nitrate hydrate, and the magnesium-containing compound may be magnesium nitrate hydrate. Therefore, providing a solution composition with increased solubility and ensuring a relatively uniform thin film may be possible.

The atomic ratio of zinc and indium may range from about 1:10 to about 10:1 in the precursor solution. In the range, the atomic ratio of zinc and indium may range from about 1:10 to about 1:1, about 1:5 to about 5:1, or about 1:5 to 1:1. The atomic ratio is maintained after forming the oxide semiconductor thin film. When zinc and indium are included in the range, the oxide thin film obtained from the precursor solution may exhibit the semiconducting characteristics.

The atomic ratio of zinc and magnesium may range from about 1:0.01 to about 1:4 in the precursor solution. In addition, an atomic ratio of the sum of indium and zinc to magnesium ranges from about 1:0.004 to about 1:0.4 in the precursor solution. The atomic ratio is maintained after forming the oxide semiconductor thin film. The magnesium may act as a factor for controlling threshold voltage and current characteristics of electronic devices when an oxide semiconductor obtained from the precursor solution is applied to an electronic device, e.g., a thin film transistor. When the magnesium is included in the range, an improved threshold voltage and current characteristics may be obtained and sufficient on-current may be obtained because the amount of indium and zinc in the oxide semiconductor is not significantly decreased.

The zinc-containing compound, indium-containing compound, and magnesium-containing compound may respectively be included at about 0.01 to about 30 wt % based on the total amount of precursor solution. When each component is included in the range, obtaining solubility may be possible.

The precursor solution may further include a solution stabilizer. The solution stabilizer may include at least one selected from the group consisting of an alcohol amine compound, e.g., monoethanol amine, diethanol amine, triethanol amine, N,N-methylethanol amine, aminoethyl ethanol amine, N-t-butylethanol amine, N-t-butyldiethanol amine, and diethylene glycol amine; an alkyl ammonium hydroxy compound, e.g., tetramethylammonium hydroxide; an alkyl amine compound, e.g., methylamine, ethylamine, and monoisopropyl amine; a ketone compound, e.g., acetylacetone; an acid compound, e.g., hydrochloric acid, nitric acid, sulfuric acid, and acetic acid; a base compound, e.g., ammonium hydroxide, potassium hydroxide, and sodium hydroxide; alkoxy alcohol, e.g., 2-(aminoethoxy)ethanol; and deionized water.

The solution stabilizer may be included in a precursor solution to increase the solubility of other components. The oxide semiconductor thin film from the precursor solution may be formed uniformly. The amount of solution stabilizer may be varied depending upon the type and amount of other components, but the solution stabilizer may be included at about 0.01 to about 30 wt % based on the total amount of the precursor solution. When the solution stabilizer is included in the range, the solution stabilizer may improve the solubility and thin film coating properties.

The zinc-containing compound, the indium-containing compound, the magnesium-containing compound, and the solution stabilizer may be mixed in a solvent to provide a precursor solution. The zinc-containing compound and the indium-containing compound may be respectively prepared by providing a solution that is mixed in each solvent, mixing the same, and mixing them with a magnesium-containing compound or a solution including a metal-containing compound. A solution stabilizer may be added to each solution of components or may be added after mixing each solution. Alternatively, a precursor solution may be prepared by mixing a zinc-containing compound, an indium-containing compound, a magnesium-containing compound, and a solution stabilizer in a solvent.

The solvent may be any solvent that dissolves the above components, and is not particularly limited. Non-limiting examples of the solvent may include at least one selected from deionized water, methanol, ethanol, propanol, isopropanol, 2-methoxyethanol, 2-ethoxyethanol, 2-propoxyethanol 2-butoxyethanol, methylcellosolve, ethylcellosolve, diethyleneglycol methylether, diethyleneglycol ethylether, dipropyleneglycol methylether, toluene, xylene, hexane, heptane, octane, ethylacetate, butylacetate, diethyleneglycol dimethylether, diethyleneglycol dimethylethylether, methylmethoxy propionic acid, ethylethoxy propionic acid, ethyl lactic acid, propylene glycol methylether acetate, propylene glycol methylether, propylene glycol propylether, methyl cellosolve acetate, ethyl cellosolve acetate, diethylene glycol methylacetate, diethylene glycol ethylacetate, acetone, methyl isobutyl ketone, cyclohexanone, dimethyl formamide (DMF), N,N-dimethyl acetamide (DMAc), N-methyl-2-pyrrolidone, γ-butyrolactone, diethylether, ethylene glycol dimethylether, diglyme, tetrahydrofuran, acetylacetone, and acetonitrile.

The solvent may be included as the balance amount based on the total amount of the solution composition excepting the amount of the components. The zinc-containing compound, indium-containing compound, and magnesium-containing compound may be precursors of an oxide semiconductor thin film, and grow to a magnesium indium zinc oxide (MgIZO) thin film including indium, zinc, and magnesium through heat treatment as follows.

As described above, the oxide semiconductor may be formed as a solution, and therefore, simplifying the process may be possible without a complicated high-cost manufacturing process, e.g., vacuum deposition.

The precursor solution according to example embodiments may include a zinc-containing compound, an indium-containing compound, and a compound including hafnium (Hf) (hereinafter, referred to as "hafnium-containing compound").

The zinc-containing compound and indium-containing compound may be the same as above described, and the atomic ratio of zinc and indium may range from about 1:10 to about 10:1 in the precursor solution.

The hafnium-containing compound may be at least one of a hafnium salt and a hydrate thereof, but is not limited thereto. Examples of the hafnium-containing compound may include at least one of hafnium halide, e.g., hafnium chloride and/or hafnium fluoride; hafnium acetate; hafnium carbonyl; hafnium carbonate; hafnium nitrate; hafnium alkoxide; and hydrates thereof.

In example embodiments, the atomic ratio of zinc and hafnium may range from about 1:0.01 to about 1:1 in the precursor solution, and in example embodiments, the atomic ratio of zinc and hafnium may range from about 1:0.05 to about 1:0.3. The hafnium may act as a factor for controlling the threshold voltage and current characteristics when the oxide semiconductor obtained from the precursor solution is applied to an electronic device, e.g., a thin film transistor. When hafnium is included in the range, the threshold voltage and current characteristics may be obtained, and simultaneously, a sufficient on-current may be obtained because the amount of zinc and indium is not significantly decreased.

The zinc-containing compound, indium-containing compound, and hafnium-containing compound may respectively be included at about 0.01 to about 30 wt % based on the total amount of precursor solution. When each component is included in the range, obtaining solubility may be possible.

The precursor solution may further include a solution stabilizer. The zinc-containing compound, indium-containing compound, and hafnium-containing compound may be precursors of an oxide semiconductor thin film, and grow to a hafnium indium zinc oxide (HfIZO) thin film including indium, zinc, and hafnium through heat treatment as follows.

As described above, the oxide semiconductor may be formed as a solution, so simplifying the process may be possible without complicated high-cost manufacturing process, e.g., vacuum deposition.

The magnesium indium zinc oxide (MgIZO) or hafnium indium zinc oxide (HfIZO) may be applied as a semiconductor of an electronic device, e.g., a thin film transistor. Hereinafter, a thin film transistor that the magnesium indium zinc oxide (MgIZO) or hafnium indium zinc oxide (HfIZO) is applied to is described referring to the drawings.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 7:
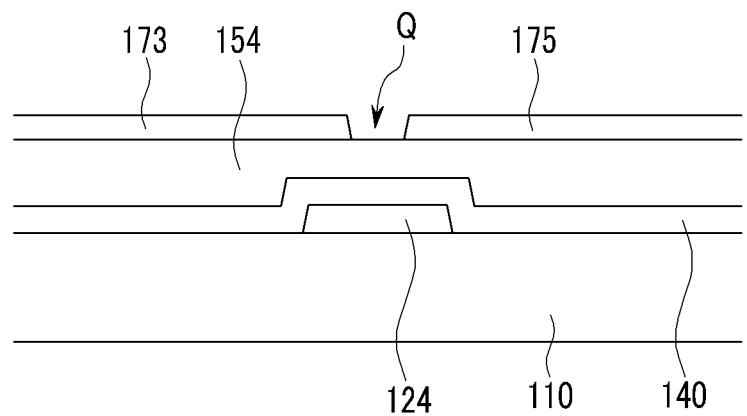

FIG. 7 is a cross-sectional view showing a thin film transistor according to example embodiments. Referring to FIG. 7, the thin film transistor may include a gate electrode 124 formed on a substrate 110, and a gate insulating layer 140 formed to cover the whole surface of the substrate and the gate electrode 124.

An oxide semiconductor 154 may be formed to overlap the gate electrode 124 on the gate insulating layer 140. The oxide semiconductor 154 may be made of magnesium indium zinc oxide (MgIZO) including indium (In), zinc (Zn), and magnesium (Mg) or hafnium indium zinc oxide (HfIZO) including indium (In), zinc (Zn), and hafnium (Hf).

A carrier concentration of the oxide semiconductor 154 may be controlled by a number of the oxygen vacancy. Magnesium (Mg) and hafnium (Hf) has oxidation power at ion state to decrease oxygen vacancy, and thereby, carrier concentration may be more easily controlled. In addition, when magnesium (Mg) and hafnium (Hf) are oxidized, their band gaps may be larger and conductivity may be decreased to reduce leakage current. Therefore, when magnesium indium zinc oxide (MgIZO) or hafnium indium zinc oxide (HfIZO) is applied to an electronic device, e.g., a thin film transistor, threshold voltage and current characteristics may be improved.

A source electrode 173 and a drain electrode 175 may be formed to face each other on the oxide semiconductor 154, and may be electrically connected with the oxide semiconductor 154 when a predetermined or given voltage is applied. A channel Q of the thin film transistor may be formed in the oxide semiconductor 154 between the source electrode 173 and the drain electrode 175.

Figure 5:
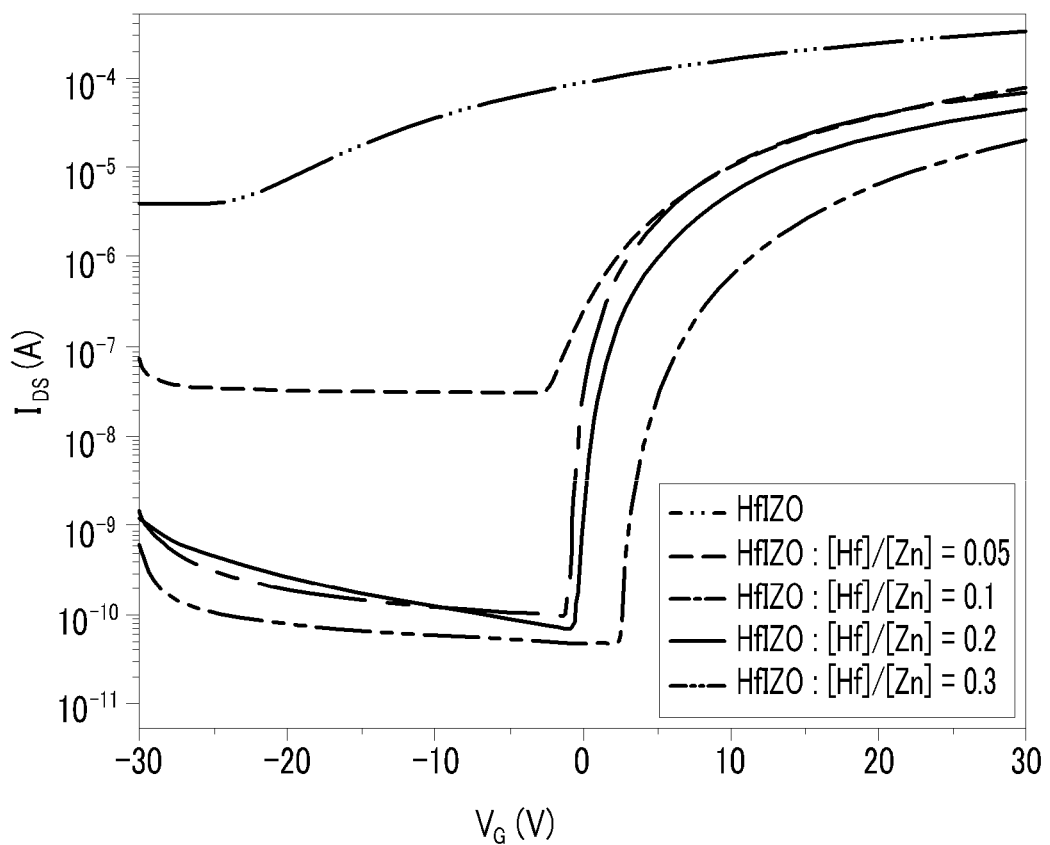
Figure 8:
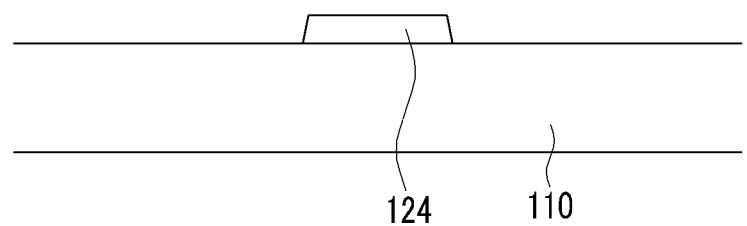
Figure 9:
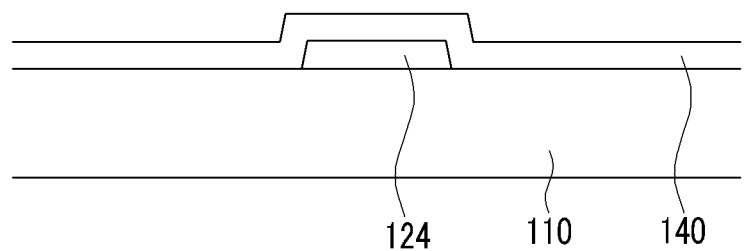
Figure 10:
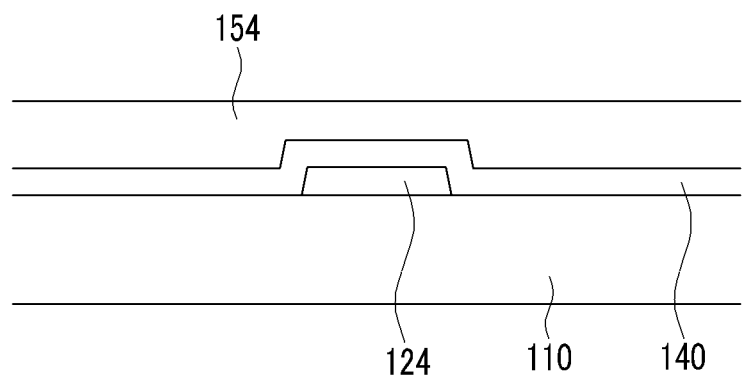

Hereinafter, a method of manufacturing a thin film transistor as shown in FIG. 5 is described referring to FIGS. 8 to 10. FIGS. 8 to 10 are cross-sectional views sequentially showing a method of manufacturing a thin film transistor shown in FIG. 7.

The zinc-containing compound, indium-containing compound, magnesium-containing compound, and solution stabilizer may be mixed in a solvent to obtain a magnesium indium zinc oxide (MgIZO) precursor solution, or the zinc-containing compound, indium-containing compound, hafnium-containing compound, and solution stabilizer may be mixed in a solvent to obtain a hafnium indium zinc oxide (HfIZO) precursor solution. Each component may be mixed in a solvent by agitating precursor solution, at for example, room temperature (about 25° C.) to about 100° C. for about 1 to about 100 hours using an agitator or ultrasonic waves. The agitating improves dissolubility and thin film coating properties. Aging may further be performed about 1 to about 240 hours. The obtained precursor solution may be present in a sol state, e.g., a colloidal suspension of solid particles in a liquid.

As illustrated in FIG. 8, a conductive layer (not shown) is deposited on the substrate 110, e.g., glass, silicon, or plastic, and subjected to photolithography to provide the gate electrode 124.

As shown in FIG. 9, an insulating layer, e.g., silicon oxide ($SiO_2$) and/or silicon nitride ($SiN_x$), and an organic insulator may be deposited on the gate electrode 124 to provide the gate insulating layer 140.

As shown in FIG. 10, the oxide semiconductor 154 may be formed on the gate insulating layer 140. The oxide semiconductor 154 may be formed using a method of spin coating, slit coating, Inkjet printing, spraying, dipping, roll-to-roll or nano imprinting the magnesium indium zinc oxide (MgIZO) precursor solution including indium-containing compound, zinc-containing compound and magnesium-containing compound, or hafnium indium zinc oxide (HfIZO) precursor solution including indium-containing compound, zinc-containing compound and and hafnium-containing compound.

The precursor solution may be subjected to heat treatment to grow a magnesium indium zinc oxide (MgIZO) thin film or a hafnium indium zinc oxide (HfIZO) thin film. Prebaking at a relatively low temperature to transform a sol solution to a gel may be performed before heat treatment at a relatively high temperature.

As shown in FIG. 7, a conductive layer (not shown) may be deposited on the oxide semiconductor 154 and subjected to photolithography to provide the source electrode 173 and the drain electrode 175.

The following examples illustrate example embodiments in more detail. However, it is understood that the scope of example embodiments is not limited to these examples.

Example I-1

Preparation of Precursor Solution

Zinc acetate dihydrate, indium nitrate hydrate, and magnesium nitrate hydrate are prepared. The zinc acetate dihydrate, indium nitrate hydrate, magnesium nitrate hydrate, and a solution stabilizer are added to a solvent and mixed to form a mixed solution of about 0.5 M. The solvent is 2-methoxyethanol and is used in an amount of about 25 to 28 ml depending on an amount of the magnesium. The solution stabilizer is monoethanol amine and acetic acid at a weight ratio of about 1:1 at each 4 g in the solvent.

The mole ratio (atomic ratio) of the indium and zinc is fixed at about 3:2 and the atomic ratio of the zinc and magnesium is fixed at about 1:0.1. Subsequently, the resultant is agitated at about 70° C. for about 1 hour on a hot plate and aging is performed for 24 hours to obtain a magnesium indium zinc oxide precursor solution in a sol state.

Fabrication of the Thin Film Transistor

On the glass substrate, molybdenum tungsten (MoW) is deposited at an about 2,000 Å thickness and a predetermined or given shaped gate electrode is formed using photolithography. Silicon nitride is deposited using a chemical vapor deposition (CVD) method at an about 2000 Å to provide a gate insulating layer. The precursor solution according to example embodiments is spin-coated on the gate insulating layer and prebaked. The spin coating is performed at about 3000 rpm for about 30 seconds and prebaking is performed at about 300° C. for about 5 minutes on a hot plate. A substrate is placed in a furnace and heat-treated at about 550° C. for about 2 hours to grow a magnesium indium zinc oxide (MgIZO) semiconductor thin film. Tantalum is deposited at an about 1000 Å thickness, and a source electrode and a drain electrode are formed using a shadow mask.

Example I-2

The precursor solution and the thin film transistor are prepared according to the same method as in Example I-1, except that the atomic ratio of the zinc and magnesium is about 1:0.2.

Example I-3

The precursor solution and the thin film transistor are prepared according to the same method as in Example I-1, except that the atomic ratio of the zinc and magnesium is about 1:0.3.

Example I-4

The precursor solution and the thin film transistor are prepared according to the same method as in Example I-1, except that the atomic ratio of the zinc and magnesium is about 1:0.4.

Example II-1

Preparation of Precursor Solution

Zinc acetate dihydrate, indium nitrate hydrate, and magnesium nitrate hydrate are prepared. The zinc acetate dihydrate, indium nitrate hydrate, magnesium nitrate hydrate, and a solution stabilizer are added to a solvent and mixed to form a mixed solution of about 0.2 M. The solvent is 2-methoxyethanol and the solution stabilizer is monoethanol amine and acetic acid.

The mole ratio (atomic ratio) of the indium and zinc is fixed at about 3:1 and the atomic ratio of the zinc and magnesium is fixed at about 1:0.1. Subsequently, the resultant is agitated at about 70° C. for about 1 hour on a hot plate and aging is performed for about 24 hours to obtain magnesium indium zinc oxide precursor solution in a sol state.

Fabrication of Thin Film Transistor

On the glass substrate, molybdenum (Mo) are deposited at an about 2000 Å thickness to form gate electrode. Silicon nitride is deposited using a chemical vapor deposition (CVD) method at an about 4000 Å to provide a gate insulating layer. The precursor solution according to the present example is spin-coated on the gate insulating layer and prebaked. The spin coating is performed at about 1000 rpm for about 30 seconds and prebaking is performed at about 250° C. for about 1 minute on a hot plate. A substrate is placed on a hot plate and heat-treated at about 450° C. for about 1 hour to grow a magnesium indium zinc oxide (MgIZO) semiconductor thin film. Aluminum is deposited at an about 1000 Å thickness, and a source electrode and a drain electrode are formed using a shadow mask.

Example II-2

The precursor solution and the thin film transistor are prepared according to the same method as in Example II-1, except that the atomic ratio of the zinc and magnesium is about 1:0.3.

Example II-3

The precursor solution and the thin film transistor are prepared according to the same method as in Example II-1, except that the atomic ratio of the zinc and magnesium is about 1:0.5.

Example III-1

Preparation of Precursor Solution

Zinc acetate dihydrate, indium nitrate hydrate, and magnesium nitrate hydrate are prepared. The zinc acetate dihydrate, indium nitrate hydrate, magnesium nitrate hydrate, and a solution stabilizer are added to a solvent and mixed to form a mixed solution of about 0.5 M. The solvent is 2-methoxyethanol and the solution stabilizer is monoethanol amine and acetic acid.

The mole ratio (atomic ratio) of the indium and zinc is fixed at about 9:1 and the atomic ratio of the zinc and magnesium is fixed at about 1:1. Subsequently, the resultant is agitated at about 70° C. for about 1 hour on a hot plate and aging is performed for about 24 hours to obtain magnesium indium zinc oxide precursor solution in a sol state.

Fabrication of Thin Film Transistor

On the glass substrate, molybdenum (Mo) are deposited at an about 2000 Å thickness and a predetermined or given shaped gate electrode is formed using photolithography. Silicon nitride is deposited using a chemical vapor deposition (CVD) method at about 4000 Å to provide a gate insulating layer. The precursor solution according to example embodiments is spin-coated on the gate insulating layer and prebaked. The spin coating is performed at about 3000 rpm for about 30 seconds and prebaking is performed at about 300° C. for about 5 minutes on a hot plate. A substrate is placed on a hot plate and heat-treated at about 450° C. for about 3 hours to grow a magnesium indium zinc oxide (MgIZO) semiconductor thin film. Subsequently, an etch stopper layer is formed on the semiconductor thin film for protecting a channel.

Molybdenum is deposited at an about 2000 Å thickness, and a source electrode and a drain electrode are formed using a photolithography.

Example III-2

The precursor solution and the thin film transistor are prepared according to the same method as in Example III-1, except that the atomic ratio of the zinc and magnesium is about 1:2.

Example III-3

The precursor solution and the thin film transistor are prepared according to the same method as in Example III-1, except that the atomic ratio of the zinc and magnesium is about 1:4.

Example IV-1

Preparation of Precursor Solution

Zinc acetate dihydrate, indium nitrate hydrate, and hafnium chloride are prepared. The zinc acetate dihydrate, indium nitrate hydrate, hafnium chloride, and a solution stabilizer are added to a solvent and mixed to form a mixed solution of about 0.5 M. The solvent is 2-methoxyethanol and is used in an amount of about 25 to 28 ml depending on an amount of the hafnium. The solution stabilizer is monoethanol amine and acetic acid at a weight ratio of about 1:1 at each 4 g in the solvent.

The mole ratio (atomic ratio) of the indium and zinc is fixed at about 3:2 and the atomic ratio of the zinc and hafnium is fixed at about 1:0.05. Subsequently, the resultant is agitated at about 70° C. for about 1 hour on a hot plate and aging is performed for about 24 hours to obtain magnesium indium zinc oxide precursor solution in a sol state.

Fabrication of Thin Film Transistor

On the glass substrate, molybdenum tungsten (MoW) are deposited at an about 2000 Å thickness and a predetermined or given shaped gate electrode is formed using photolithography. Silicon nitride is deposited using a chemical vapor deposition (CVD) method at an about 2000 Å thickness to provide a gate insulating layer. The precursor solution according to example embodiments is spin-coated on the gate insulating layer and prebaked. The spin coating is performed at about 3000 rpm for about 30 seconds and prebaking is performed at about 300° C. for about 5 minutes on a hot plate. A substrate is placed in a furnace and heat-treated at about 550° C. for about 2 hours to grow a hafnium indium zinc oxide (MgIZO) semiconductor thin film. Tantalum is deposited at an about 1000 Å thickness, and a source electrode and a drain electrode are formed using a shadow mask.

Example IV-2

The precursor solution and the thin film transistor are prepared according to the same method as in Example IV-1, except that the atomic ratio of the zinc and hafnium is about 1:0.1.

Example IV-3

The precursor solution and the thin film transistor are prepared according to the same method as in Example IV-1, except that the atomic ratio of the zinc and hafnium is about 1:0.2.

Example IV-4

The precursor solution and the thin film transistor are prepared according to the same method as in Example IV-1, except that the atomic ratio of the zinc and hafnium is about 1:0.3.

Comparative Example 1

The precursor solution is prepared according to the same method as in Example I-1, except that magnesium nitrate hydrate is not used.

Comparative Example 2

The precursor solution is prepared according to the same method as in Example IV-1, except that hafnium chloride is not used.

Performance Evaluation 1

The thin film transistors fabricated using the precursor solution according to Examples I-1 to I-4 and Comparative Example 1 are evaluated with respect to a threshold voltage, a current ratio, and charge mobility according to amounts of magnesium.

The evaluation results are shown in the following Table 1 and FIG. 1. FIG. 1 is a graph showing the current characteristics of the thin film transistors according to Examples I-1 to I-4 and Comparative Example 1.

TABLE 1

| | | Threshold Voltage (Vth) | Current Ratio (Ion/Ioff) | Mobility (cm²/Vs) |
|---|---|---|---|---|
| Example I-1 | MgIZO[Mg/Zn = 0.1] | −5.52 | $1.07 \times 10^3$ | 0.72 |
| Example I-2 | MgIZO[Mg/Zn = 0.2] | 2.66 | $6.57 \times 10^6$ | 1.33 |
| Example I-3 | MgIZO[Mg/Zn = 0.3] | 2.37 | $2.25 \times 10^6$ | 0.79 |
| Example I-4 | MgIZO[Mg/Zn = 0.4] | 4.54 | $1.05 \times 10^6$ | 0.53 |
| Comparative Example 1 | IZO | −24.05 | $1.41 \times 10^2$ | 1.16 |

Referring to Table 1 and FIG. 1, the thin film transistor according to Examples I-1 to I-4 shows a lower threshold voltage, a higher current ratio, and more stable charge mobility of 0.5 cm²/Vs or more. On the contrary, the thin film transistor according to Comparative Example 1 shows a higher threshold voltage and a lower current ratio due to higher off current ($I_{off}$). Therefore, the magnesium indium zinc oxide (MgIZO) semiconductor thin film improves properties of the thin film transistor.

Performance Evaluation 2

The thin film transistors fabricated using the precursor solution according to Examples I-1 to I-4 and Comparative Example 1 are evaluated with respect to hysteresis characteristics according to amounts of magnesium. Hysteresis characteristics are evaluated as follows: forward bias and backward bias are applied to the thin film transistor and voltage changes at a predetermined or given current between forward bias and backward bias application are measured.

Figure 2A:
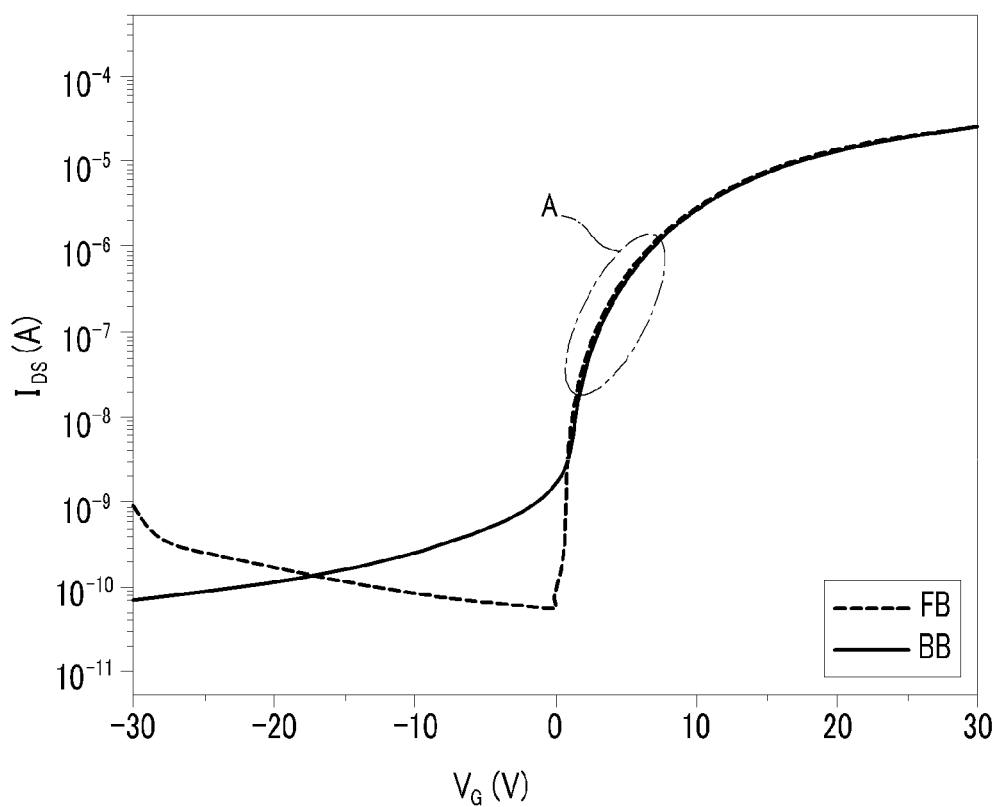
FIGS. 2A and 2B are graphs showing hysteresis characteristics of the thin film transistors according to Examples I-1 to I-4.
Figure 2B:
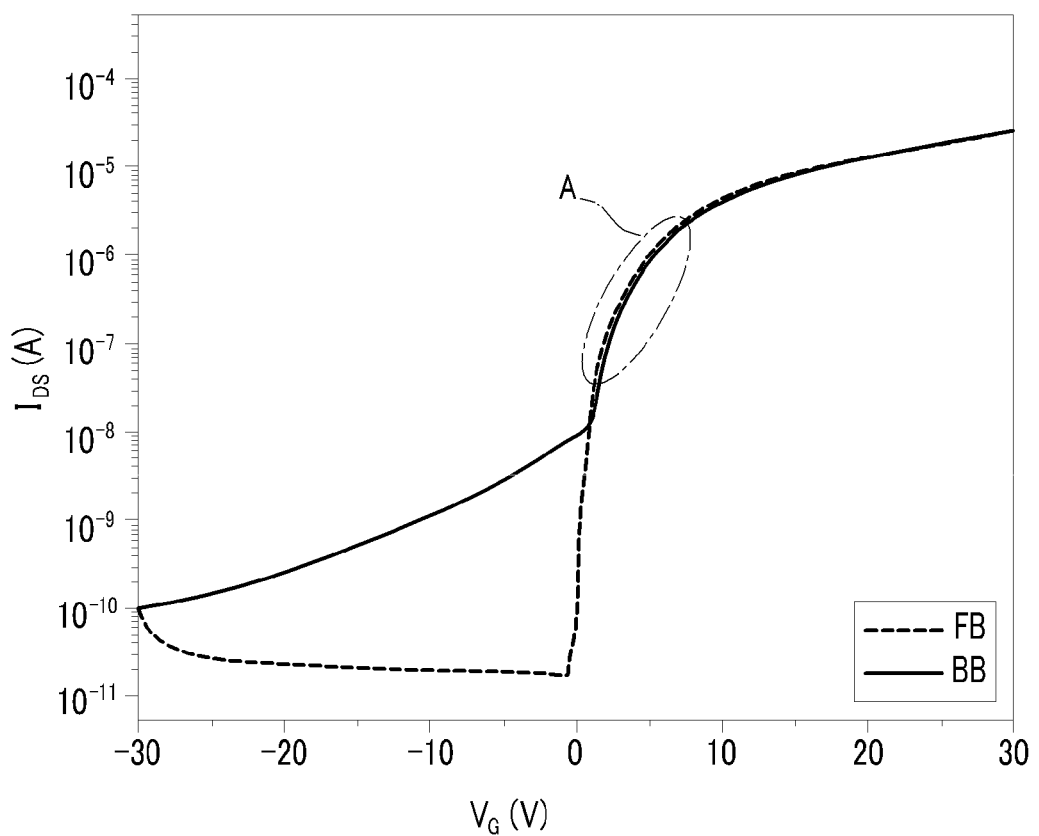

The evaluation results are described referring to FIGS. 2A and 2B. FIGS. 2A and 2B are graphs showing hysteresis characteristics of the thin film transistors according to Examples I-1 to I-4.

In more detail, FIG. 2A is a graph showing results of the thin film transistor according to Example I-2, and FIG. 2B is a graph showing results of the thin film transistor according to Example I-3.

Hysteresis characteristics are deemed improved when voltage changes at 'A' portion of the forward bias curved line (FB) and backward bias curved line (BB). As shown in FIG. 2A, at an 'A' portion, two curved lines (FB, BB) are nearly overlapped indicating improved hysteresis characteristics.

Likewise, in FIG. 2B, at an 'A' portion, two curved lines (FB, BB) are nearly overlapped indicating improved hysteresis characteristics.

Performance Evaluation 3

The thin film transistors fabricated using the precursor solutions according to Examples II-1 to II-3 are evaluated with respect to charge mobility and turn-on voltage.

The evaluation results are shown in the following Table 2 and FIG. 3.

Figure 3:
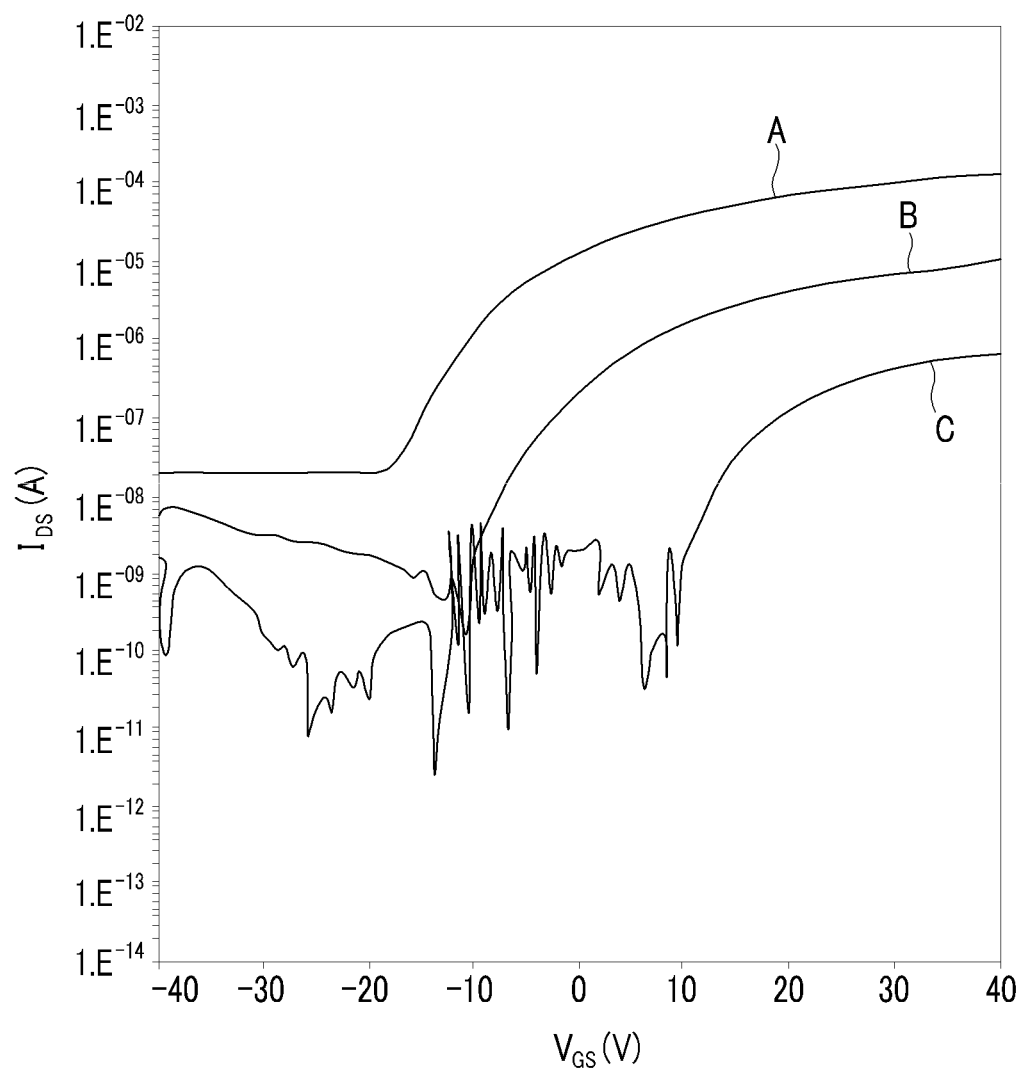

FIG. 3 is a graph showing the current characteristics of the thin film transistors according to Examples II-1 to II-3. In FIG. 3, 'A', 'B', and 'C' are current characteristics of the thin film transistors according to Examples II-1 to II-3, respectively.

TABLE 2

|  | Example II-1 | Example II-2 | Example II-3 |
|---|---|---|---|
| Mg/Zn | 0.1 | 0.3 | 0.5 |
| Mg/(In + Zn) | 0.025 | 0.075 | 0.125 |
| Mobility (at 10 V) (cm$^2$/Vs) | 2.3 | 0.2 | 0.02 |
| Turn-on Voltage (V) | −17 | −10 | 10 |

Referring to Table 2 and FIG. 3, the thin film transistor according to Examples II-1 to II-3 shows a lower threshold voltage and more stable charge mobility of 0.5 cm$^2$/Vs or more.

Performance Evaluation 4

The thin film transistors fabricated using the precursor solutions according to Examples III-1 to III-3 are evaluated with respect to charge mobility and turn-on voltage.

Figure 4:
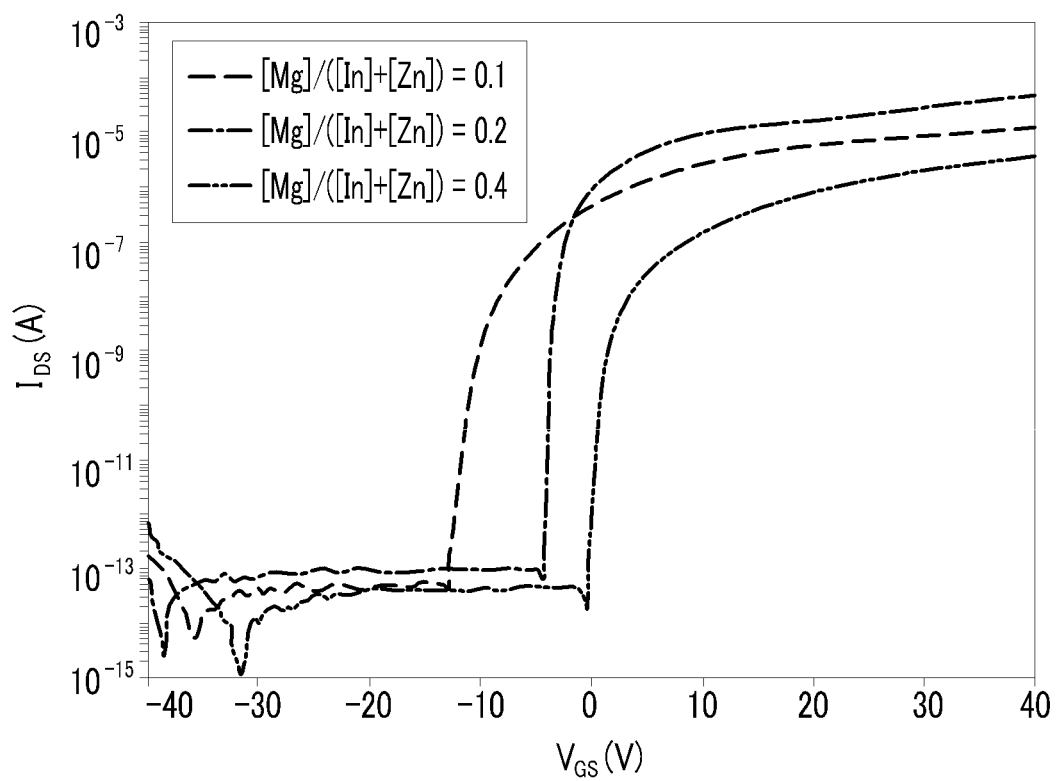

The evaluation results are shown in the following Table 3 and FIG. 4. FIG. 4 is a graph showing the current characteristics of the thin film transistors according to Examples III-1 to III-3.

TABLE 3

|  | Example III-1 | Example III-2 | Example III-3 |
|---|---|---|---|
| Mg/Zn | 1 | 2 | 4 |
| Mg/(In + Zn) | 0.1 | 0.2 | 0.4 |
| mobility (at 10 V) (cm$^2$/Vs) | 0.7 | 2.7 | 0.4 |
| Turn-on Voltage (V) | −12.5 | −3 | −1 |

Referring to Table 3 and FIG. 4, the thin film transistors according to Examples III-1 to III-3 shows a lower turn-on voltage and more stable charge mobility.

Performance Evaluation 5

The thin film transistors according to Examples IV-1 to IV-4 and Comparative Example 2 are evaluated with respect to mobility, threshold voltage and current ratio.

The evaluation results are shown in the following Table 4 and FIG. 5. FIG. 5 is a graph showing the current characteristics of the thin film transistors according to Examples IV-1 to IV-4 and Comparative Example 2.

TABLE 4

|  |  | Max Current ($I_{d,max}$) | Minimum Current ($I_{d,min}$) | Threshold Voltage ($V^{th}$) | Current ratio ($I_{on}/I_{off}$) | mobility (cm$^2$/Vs) |
|---|---|---|---|---|---|---|
| Example IV-1 | HfIZO[Hf/Zn = 0.05] | $6.01 \times 10^{-5}$ | $8.92 \times 10^{-9}$ | 1.55 | $6.75 \times 10^3$ | 1.22 |
| Example IV-2 | HfIZO[Hf/Zn = 0.1] | $5.26 \times 10^{-5}$ | $1.45 \times 10^{-11}$ | 2.06 | $3.64 \times 10^6$ | 1.25 |
| Example IV-3 | HfIZO[Hf/Zn = 0.2] | $3.22 \times 10^{-5}$ | $9.93 \times 10^{-12}$ | 3.49 | $3.24 \times 10^6$ | 0.81 |
| Example IV-4 | HfIZO[Hf/Zn = 0.3] | $1.33 \times 10^{-5}$ | $6.30 \times 10^{-12}$ | 11.17 | $2.11 \times 10^6$ | 0.57 |
| Comparative Example 2 | IZO | $3.00 \times 10^{-4}$ | $2.14 \times 10^{-6}$ | −24.05 | $1.41 \times 10^2$ | 1.16 |

Referring to Table 4 and FIG. 5, the thin film transistor according to Examples IV-1 to IV-4 shows a lower threshold voltage, a higher current ratio, and more stable charge mobility of 0.5 cm$^2$/Vs or more. On the contrary, the thin film transistor according to Comparative Example 2 shows a higher threshold voltage and a lower current ratio due to higher minimum current (off current, $I_{off}$). Therefore, hafnium indium zinc oxide (HfIZO) semiconductor thin film improves properties of the thin film transistor.

Performance Evaluation 6

The thin film transistors fabricated using the precursor solution according to Examples IV-2, IV-3 and Comparative Example 2 are evaluated with respect to hysteresis characteristics.

Figure 6A:
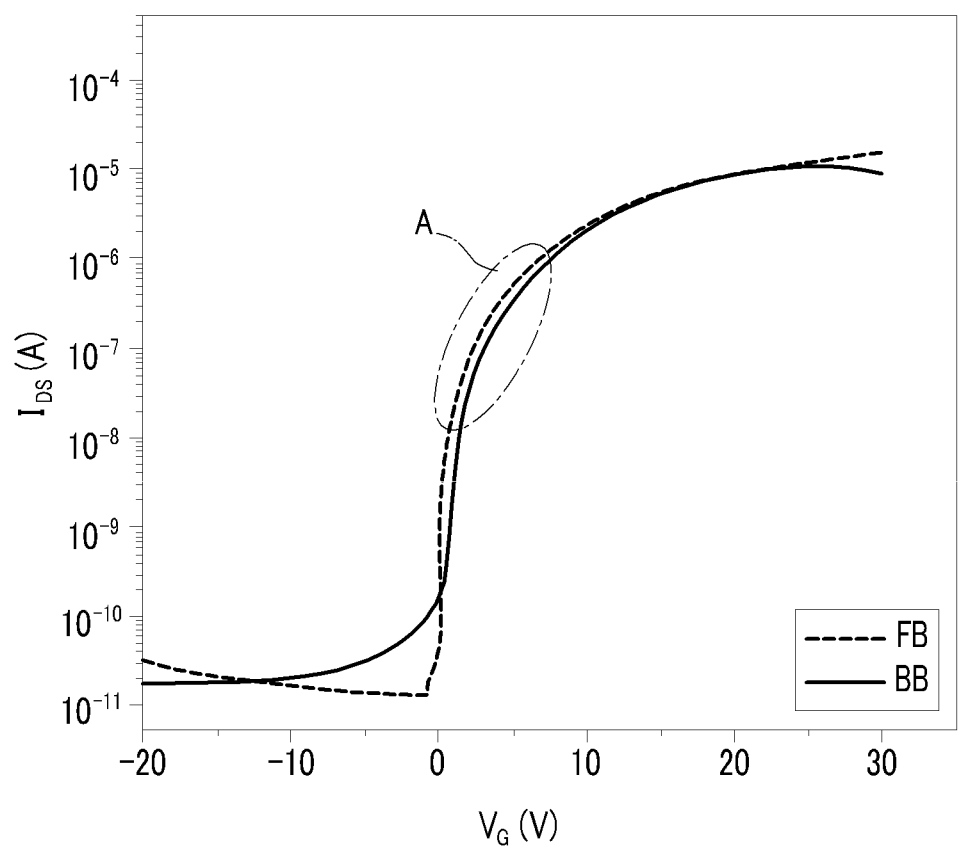
FIGS. 6A and 6B are graphs showing hysteresis characteristics of the thin film transistors according to Example IV-2, Example IV-3 and Comparative Example 2.
Figure 6B:
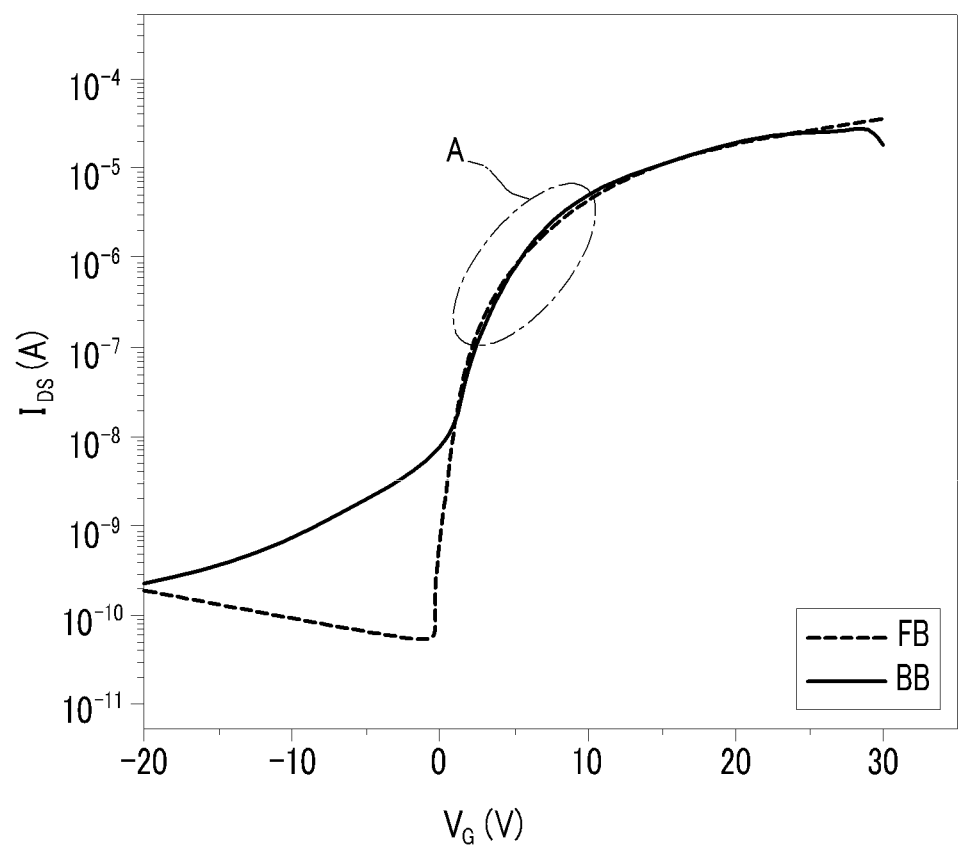

The evaluation results are described referring to FIGS. 6A and 6B. FIGS. 6A and 6B are graphs showing hysteresis characteristics of the thin film transistors according to Examples IV-2, IV-3 and Comparative Example 2.

In more detail, FIG. 6A is a graph showing results of the thin film transistor according to Example IV-2, and FIG. 6B is a graph showing results of the thin film transistor according to Example IV-3

As shown in FIG. 6A, at the 'A' portion, two curved lines (FB, BB) are nearly overlapped indicating improved hysteresis characteristics. Likewise, in FIG. 6B, at the 'A' portion, two curved lines (FB, BB) are nearly overlapped indicating improved hysteresis characteristics.

The above description is given for a thin film transistor of a bottom gate structure, but is not limited thereto. The thin film of example embodiments may similarly apply to a thin film transistor of any structure, e.g., a top gate structure. The above description is given for an oxide semiconductor applied to a thin film transistor, but is not limited thereto. The oxide semiconductor of example embodiments may similarly apply to any electronic device requiring a semiconductor thin film.

While example embodiments have been described, it is to be understood that example embodiments are not limited to those disclosed herein, but, on the contrary, are intended to cover various modifications and equivalent arrangements included within the spirit and scope of the appended claims.

What is claimed is:

1. A solution composition for forming an oxide thin film, comprising:
   a first compound including zinc;
   a second compound including indium; and
   a third compound including hafnium,
   wherein the zinc and hafnium are included at an atomic ratio of about 1:0.01 to about 1:1, and
   wherein the first compound includes zinc acetate hydrate, the second compound includes indium nitrate hydrate, and the third compound includes hafnium chloride.

2. The solution composition of claim 1, wherein the zinc and hafnium are included at an atomic ratio of about 1:0.05 to about 1:0.3.

3. The solution composition of claim 1, further comprising:
   at least one of an alcohol amine compound, ketone compound, an acid compound, a base compound, and deionized water.

* * * * *

UNITED STATES PATENT AND TRADEMARK OFFICE
CERTIFICATE OF CORRECTION

| | |
|---|---|
| PATENT NO. | : 8,658,546 B2 |
| APPLICATION NO. | : 13/650819 |
| DATED | : February 25, 2014 |
| INVENTOR(S) | : Seon et al. |

It is certified that error appears in the above-identified patent and that said Letters Patent is hereby corrected as shown below:

On the Title Page item [73] Assignees should read: Samsung Electronics Co., Ltd., Gyeonggi-do (KR); Industry-Academic Cooperation Foundation, Yonsei University, Seoul (KR)

Signed and Sealed this
First Day of July, 2014

Michelle K. Lee
*Deputy Director of the United States Patent and Trademark Office*